(12) United States Patent
Nakamura et al.

(10) Patent No.: US 6,614,077 B2
(45) Date of Patent: Sep. 2, 2003

(54) SEMICONDUCTOR DEVICE IMPROVED IN ESD RELIABILITY

(75) Inventors: Kazutoshi Nakamura, Yokohama (JP);
Akio Nakagawa, Fujisawa (JP);
Yusuke Kawaguchi, Miura-gun (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 89 days.

(21) Appl. No.: 09/796,427

(22) Filed: Mar. 2, 2001

(65) Prior Publication Data

US 2001/0025961 A1 Oct. 4, 2001

(30) Foreign Application Priority Data

Mar. 3, 2000  (JP) ........................ 2000-059122
Feb. 26, 2001 (JP) ........................ 2001-050776

(51) Int. Cl.$^7$ .............................................. H01L 23/62
(52) U.S. Cl. .................... 257/355; 257/341; 257/343
(58) Field of Search ................ 257/355, 343, 257/341, 603, 379, 344

(56) References Cited

U.S. PATENT DOCUMENTS

| | | |
|---|---|---|
| 4,672,407 A | 6/1987 | Nakagawa et al. |
| 4,680,604 A | 7/1987 | Nakagawa et al. |
| 4,689,647 A | 8/1987 | Nakagawa et al. |
| 4,831,423 A | 5/1989 | Shannon |
| 4,928,155 A | 5/1990 | Nakagawa et al. |
| 4,980,743 A | 12/1990 | Nakagawa et al. |
| 4,989,058 A | 1/1991 | Colak et al. |
| 5,068,700 A | 11/1991 | Yamaguchi et al. |
| 5,105,243 A | 4/1992 | Nakagawa et al. |
| 5,168,333 A | 12/1992 | Nakagawa et al. |
| 5,453,384 A | 9/1995 | Chatterjee |
| 5,633,515 A | 5/1997 | Gantioler et al. |
| 5,731,603 A | 3/1998 | Nakagawa et al. |
| 5,907,462 A | 5/1999 | Chatterjee et al. |
| 6,064,249 A | 5/2000 | Duvvury et al. |
| 6,133,607 A | 10/2000 | Funaki et al. |
| 6,137,140 A | 10/2000 | Efland et al. |
| 6,492,691 B2 * | 12/2002 | Magri' et al. ............... 257/401 |

OTHER PUBLICATIONS

Byeong–Hoon Lee, et al., IEEE Electron Device Letters, vol. 19, No. 12, pp. 490–492, "A New Gradual Hole Injection Dual–Gate Ligbt", Dec. 1998.
S. Pendharkar, et al., IEEE International Symposium on Power Semiconductor Devices and IC'S, pp. 341–344, "SCR–LDMOS—A Novel LDMOS Device with ESD Robustness", May 22–25, 2000.
M. R. Simpson, et al., IEEE International Electron Devices Meeting, pp. 740–743, "Analysis of the Lateral Insulated Gate Transistor", 1985.

* cited by examiner

Primary Examiner—Mark V. Prenty
(74) Attorney, Agent, or Firm—Oblon, Spivak, McClelland, Maier & Neustadt, P.C.

(57) ABSTRACT

In an LDMOS, a $p^+$-type anode layer is formed adjacent to an $n^+$-type drain layer. The anode layer makes no contribution to an operation of the LDMOS at a rated voltage and generates holes at the time of ESD. The holes flow into the base layer through the active layer. Electrons flow from a source layer into the drain layer through the active layer. A parasitic thyristor of the LDMOS thus operates, with the result that a source-to-drain holding voltage can be lowered when a large current flows and the current distribution can be uniformed.

23 Claims, 7 Drawing Sheets

SEMICONDUCTOR DEVICE IMPROVED IN ESD RELIABILITY

CROSS-REFERENCE TO RELATED APPLICATIONS

This application is based upon and claims the benefit of priority from the prior Japanese Patent Applications No. 2000-059122, filed Mar. 3, 2000; and No. 2001-050776, filed Feb. 26, 2001, the entire contents of both of which are incorporated herein by reference.

BACKGROUND OF THE INVENTION

The present invention relates to a semiconductor device such as a high voltage device. More specifically, the present invention relates to an LDMOS (lateral double-diffusion MOSFET) that is improved in ESD (electrostatic discharge) reliability.

Power ICs are generally constituted of both a low-voltage device and a high voltage device and widely used in, for example, the auto mobile applications. On-vehicle semiconductor devices are used in harsh environments and thus require relatively high-level protection against ESD and another type of electrical transient pulse. The ESD is considered to be a high-energy pulse caused when a person or a thing bearing electrical charges comes into contact with an integrated circuit. As one method of protecting a semiconductor device against the ESD, a resistance element can be inserted between a semiconductor element and an output pin to lower the level of a voltage. However, an LDMOS typically requires compatibility between low on-resistance and high breakdown voltage as power device. It is not therefore advisable to insert the resistance element because the low-on-resistance characteristic of the LDMOS is degraded.

FIG. 17 shows a prior art n-type LDMOS. In this LDMOS, an $n^+$-type buried layer 12 is formed in a $p^-$-type substrate 11. An n-type active layer 13 epitaxially grows on the buried layer 12. A p-type base layer 14 is selectively formed in the active layer 13, and an $n^+$-type source layer 15 and a $p^+$-type diffusion layer 14a are formed in the base layer 14. An $n^+$-type drain layer 16 is formed at a distance from the base layer 14 of the active layer 13. A LOCOS oxide film 17 is formed in a surface area of the active layer 13 between the drain and base layers 16 and 14. A gate electrode (G) 18 is formed between the source layer 15 and the LOCOS oxide film 17 and above the active layer 13 and the base layer 14 with a gate insulation film (not shown) interposed therebetween. A source electrode (S) 19 is provided on the diffusion and source layers 14a and 15, while a drain electrode (D) 20 is provided on the drain layer 16.

In the above structure of the prior art LDMOS, when an intensive electric field is applied to the drain layer 16 by ESD, an avalanche breakdown occurs at one end portion of the drain layer 16, toward the LOCOS oxide film 17, to thereby generate electrons and holes. The electrons flow into the drain layer 16 from the end portion of the drain layer 16, while the holes flow into the base layer 14 therefrom. Thus, a parasitic bipolar transistor, which is constituted of the $n^+$-type drain layer 16, p-type base layer 14, and $n^+$-type source layer 15, turns on and accordingly the voltage between the source and drain layers is clamped to a lower one. However, current concentrates locally on the end portion of the drain layer 16, where a thermal runaway occurs. The prior art LDMOS therefore has the problem that adequate ESD reliability cannot be obtained and, in extreme cases, the drain layer is destroyed.

BRIEF SUMMARY OF THE INVENTION

The present invention has been developed to resolve the above problem. An object of the present invention is to provide a semiconductor device capable of mitigating the concentration of current on an end portion of a drain layer under ESD stress and lowering a holding voltage more than that of the prior art LDMOS when a large amount of current flows, thereby improving in ESD reliability.

The above object is attained by the following device: A semiconductor device comprising: an active layer of a first conductivity type; a base layer of a second conductivity type formed in a surface area of the active layer; a source layer of the first conductivity type formed in a surface area of the base layer; a drain layer of the first conductivity type formed in the surface area of the active layer at a distance from the base layer; an anode layer of the second conductivity type formed adjacent to the drain layer between the base layer and the drain layer; a gate layer formed between the source layer and the drain layer and on the base layer with a gate insulation film interposed therebetween; a source electrode formed on a surface of the base layer and that of the source layer; and a drain electrode formed on a surface of the drain layer and that of the anode layer, wherein the anode layer constitutes a parasitic thyristor, together with the source layer, the base layer, and the active layer, when ESD occurs.

The semiconductor device described above mitigates the concentration of current on an end portion of the drain layer under ESD stress and lowers a holding voltage more than that of a prior art LDMOS when a large amount of current flows. The ESD reliability can be improved accordingly.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

Figure 1:
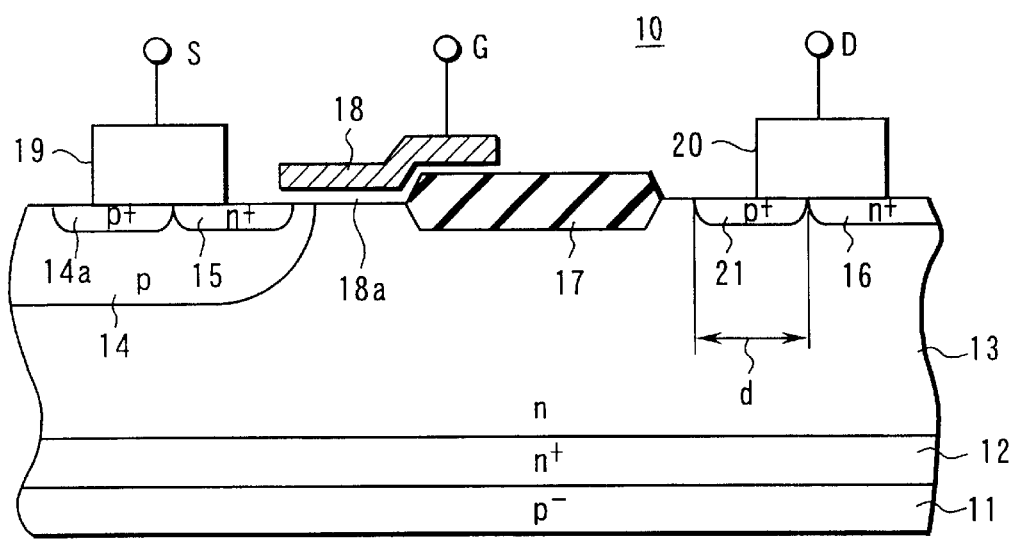
FIG. 1 is a cross-sectional view showing a semiconductor device according to a first embodiment of the present invention.

FIG. 1 illustrates an LDMOS 10 according to a first embodiment of the present invention. In FIG. 1, an $n^+$-type buried layer 12 is formed in a $p^-$-type substrate 11. An n-type active layer 13 is formed on the buried layer 12 by epitaxial growth. A p-type base layer 14 is selectively formed in the active layer 13. An $n^+$-type source layer 15 and a $p^+$-type diffusion layer 14a are formed in the base layer 14. An $n^+$-type drain layer 16 is formed at a distance from the base layer 14 of the active layer 13. An LOCOS oxide film 17 is formed in a surface area of the active layer 13 between the drain layer 16 and the base layer 14.

A $p^+$-type anode layer 21 is formed in contact with the drain layer 16 in the active layer 13 between the LOCOS oxide film 17 and the drain layer 16. The anode layer 21 makes no contribution to the operation of the LDMOS 10 within the range of the rated voltage but causes holes to flow into the active layer 13 at the time of ESD. The conditions for preventing hole current from flowing into the active layer 13 from the anode layer 21 within the range of the rated voltage will be described later.

A gate electrode (G) 18 is formed above the active layer 13 and the base layer 14 between the source layer 15 and the LOCOS oxide film 17. A gate insulation film 18a is interposed between the gate electrode (G) 18 and the active and base layers 13 and 14. A source electrode (S) 19, which is formed of aluminum wiring (1A1) of the first layer, is connected to the source layer 15 and the diffusion layer 14a. A drain electrode (D) 20, which is formed of aluminum wiring (1A1) of the first layer, is connected to the drain layer 16 and the anode layer 21.

Several conditions for preventing holes from flowing into the active layer 13 from the anode layer 21 within the range of the rated voltage can be considered. If sheet resistance Rs of the active layer 13, which is located directly under the anode layer 21, is considered to be one of the conditions, it is expressed by the following formula (1) when the length of the anode layer 21 is d (cm) and the rated drain current per centimeter of channel width is ID:

$$Rs \leq 0.8 / d \cdot 1 / ID \, (\Omega / \square) \quad (1)$$

Another condition can be considered as follows: Assuming that the thickness of the gate insulation film is tox (cm), the rated gate voltage is Vg (V), the rated drain voltage is Vd (V), and the breakdown voltage (the breakdown voltage at the gate voltage of 0V) is Vb (V), no hole current flows from the anode layer 21 into the active layer 13 within the range satisfying the following formulae (2) and (3):

$$Vg \leq 2 \times 10^6 \cdot tox \quad (2)$$

$$Vd \leq 0.7 \cdot Vb \quad (3)$$

Figure 2:
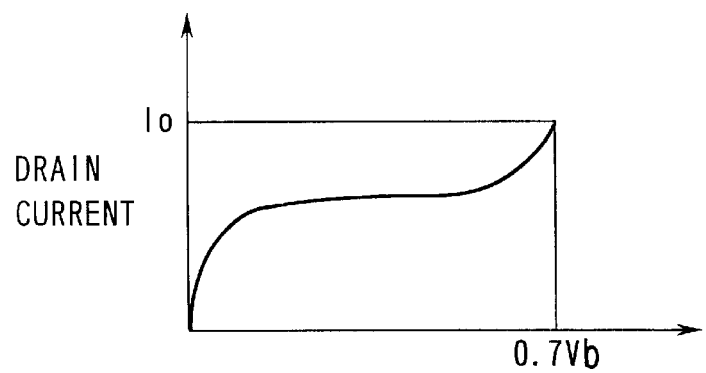
FIG. 2 is a graph showing an operation of the device shown in FIG. 1 at its rated voltage.

FIG. 2 shows an operation of the LDMOS with the anode layer 21 at a rated voltage. Within the range of the rated voltage, the LDMOS operates as a normal one to cause electrons to flow from the source layer 15 to the drain layer 16, as shown in FIG. 2. The anode layer 21 therefore fulfills no functions when the LDMOS operates within the rated range.

Figure 3:
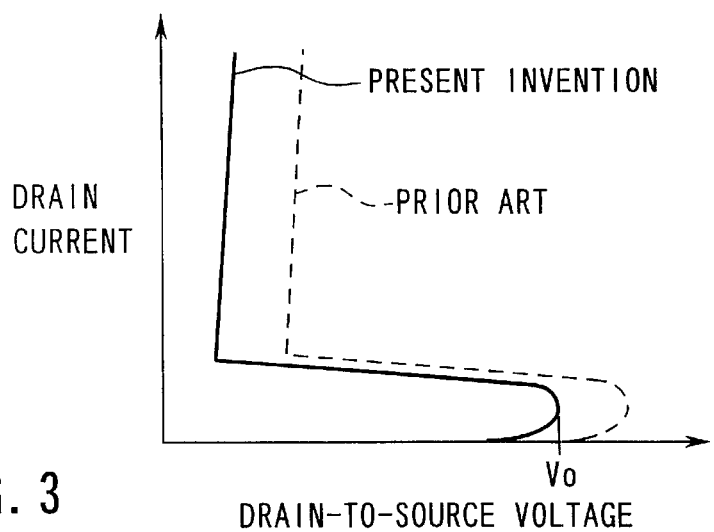
FIG. 3 is a graph showing an operation of the device shown in FIG. 1 under ESD stress.

When a voltage over the rated voltage is applied to the drain electrode 20 under ESD, a depletion layer extends from the base layer 14 and an electric field is strengthened near the anode layer 21. Thus, an avalanche breakdown occurs to generate electrons and holes. The electrons flow into the drain layer 16. The flow of large electron current into the drain layer 16 lowers the voltage of the n-type active layer 13 near the anode layer 21. If this voltage finally drops by a built-in potential between the n-type active layer 13 and the $p^+$-type anode layer 21, the hole current flows into the active layer 13 from the anode layer 21 and then into the base layer 14 from the active layer 13. The flow of large hole current into the base layer 14 lowers the voltage of the base layer 14 near the source layer 15. When this voltage drops by a built-in potential between the base layer 14 and the source layer 15, the electrons flow into the drain layer 16 from the source layer 15. It has been explained that a parasitic pnp transistor constituted of the anode layer 21, active layer 13 and base layer 14 turns on and a parasitic npn transistor constituted of the source layer 15, base layer 14 and drain layer 16 turns on. There are cases where the parasitic npn transistor first turns on and then the parasitic pnp transistor turns on. At this time, a parasitic thyristor constituted of the $n^+$-type source layer 15, p-type base layer 14, n-type active layer 13 and $p^+$-type anode layer 21 turns on and, as indicated by the solid line in FIG. 3, a source-to-drain voltage is latched at a low voltage.

Figure 17:
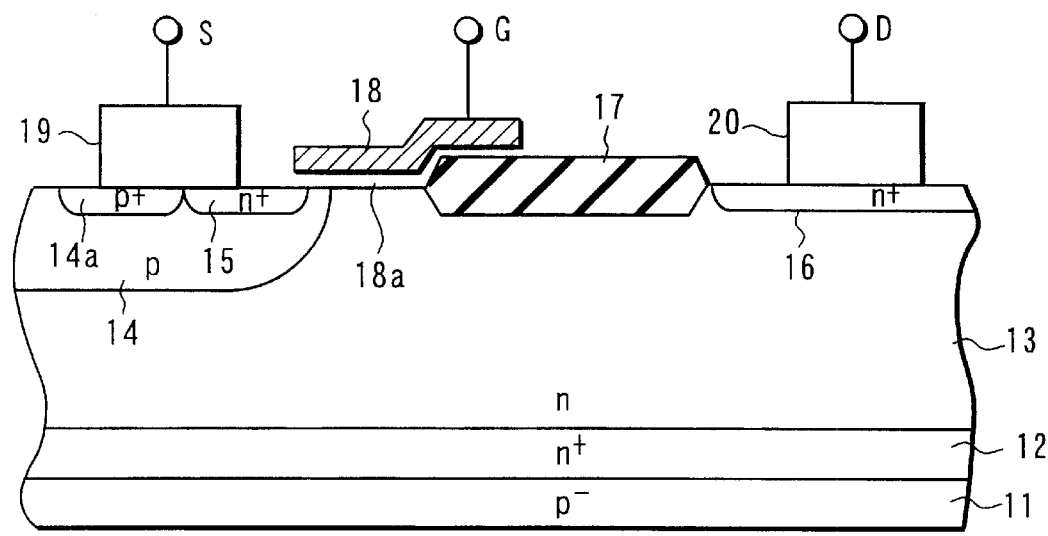
FIG. 17 is a cross-sectional view showing a prior art LDMOS.

In the prior art LDMOS illustrated in FIG. 17, the parasitic bipolar transistor (npn transistor) operates at the time of ESD to allow electron current to flow between the source and drain and thus clamp the voltage therebetween. In contrast, according to the present invention, the parasitic thyristor of the LDMOS operates to allow hole and electron current between the source and drain layers 15 and 16. The clamped voltage can thus be decreased more than that of the prior art LDMOS, as indicated by the broken line in FIG. 3.

The injection of holes from the anode layer 21 into the active layer 13 lowers the conductivity of the layer 13 near the drain layer 16 and thus causes the electron current to flow over a wide range without concentrating on the end portion of the drain layer 16. For this reason, a thermal runaway can be prevented from occurring at the end portion of the drain layer 16 and the transistor can be prevented from being destroyed.

According to the first embodiment described above, the p+-type anode layer 21 is provided adjacent to the n+-type drain layer 16 of the LDMOS 10, and the sheet resistance of the active layer 13 located immediately under the anode layer 21 is set low. The LDMOS 10 operates as a normal one without causing holes to flow from the anode layer 21 into the active layer 13 within the range of the rated voltage. The hole current flows from the anode layer 21 into the active layer 13 to turn on the parasitic lateral thyristor at the time of ESD. Thus, a source-to-drain holding voltage can be lowered when a large amount of current flows, and the current distribution can be uniformed, with the result that the ESD strength can be improved.

Since, moreover, the current distribution is uniform, the current can be prevented from concentrating on the end portion of the drain layer 16 and a thermal runaway can be avoided at the time of ESD.

Figure 4:
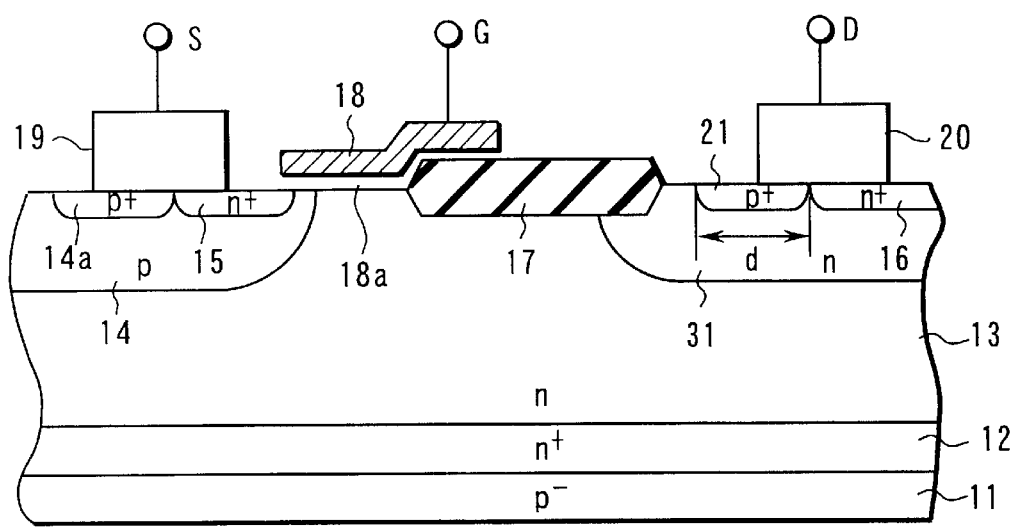
FIG. 4 is a cross-sectional view showing a semiconductor device according to a second embodiment of the present invention.

FIG. 4 illustrates a semiconductor device according to a second embodiment of the present invention. In FIG. 4, the same constituting elements as those of FIG. 1 are indicated by the same reference numerals and only the elements different therefrom will now be described. In FIG. 4, an active layer 13 includes an n-type buffer layer 31, and both a drain layer 16 and an anode layer 21 are formed inside the buffer layer 31. The formation of the n-type buffer layer 31 allows the anode layer 21 to decrease in resistivity. Implanting phosphorus ions into the active layer 13 forms the buffer layer 31. It is desirable that dose n1 of ions in the buffer layer 31 satisfies the following formula (4) when the mobility of carriers is $\mu$ (cm$^2$/V·S), the length of the anode layer 21 is d(cm), the drain current of the gate electrode 18 at the rated voltage per centimeter of channel width is ID, and the amount of electron charge is q(C):

$$\frac{5}{8} \cdot (ID \cdot d)/(q \cdot \mu) \leq n1 \quad (4)$$

The foregoing formulae of the sheet resistance and the dose are not varied regardless of whether the buffer layer 31 is present or absent.

It is desirable that the resistance Rs of the n-type buffer layer 31 satisfies the condition of the above formula (1). The buffer layer 31 lessens a voltage drop due to electron current flowing directly under the anode layer 21 within the range of the rated voltage. It is thus possible to prevent holes from being injected into the active layer 13 from the anode layer 21.

Figure 5:
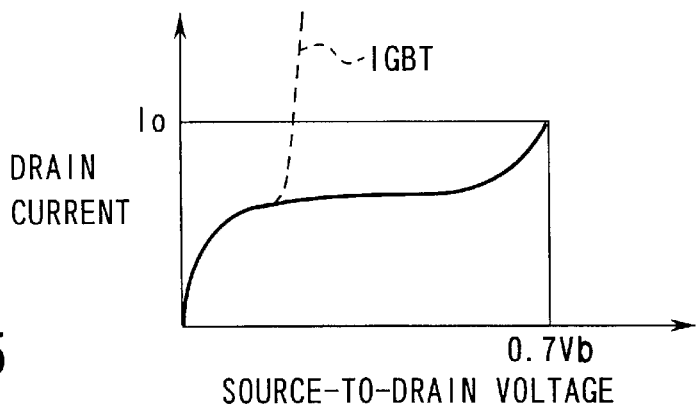
FIG. 5 is a graph showing an operation of the device shown in FIG. 4 at a rated voltage and that of an IGBT.

If the n-type buffer layer 31 is not formed and the sheet resistance of the active layer 13 formed immediately under the anode layer 21 is higher than that of the condition indicated by the formula (1), the LDMOS performs the same operation as that of the IGBT within the range of the rated voltage as indicated by the broken line in FIG. 5. In the second embodiment, however, dose n2 is set to $1.4 \times 10^{13}$/cm$^2$ when $\mu$ is 400 (cm$^2$/V·S), d=$1.5 \times 10^{-4}$ (cm), and ID=9.4 (A/cm). Consequently, the anode layer 21 makes no contribution to the operation of the LDMOS within the range of the rated voltage.

According to the second embodiment, both the drain layer 16 and anode layer 21 are formed in the n-type buffer layer 31 whose resistivity is low. The same advantage as that of the first embodiment can thus be obtained from the second embodiment. Furthermore, the n-type buffer layer 31 allows the resistivity of the buffer layer 31 directly under the anode layer 21 to be easily set at a desired one.

Figure 6:
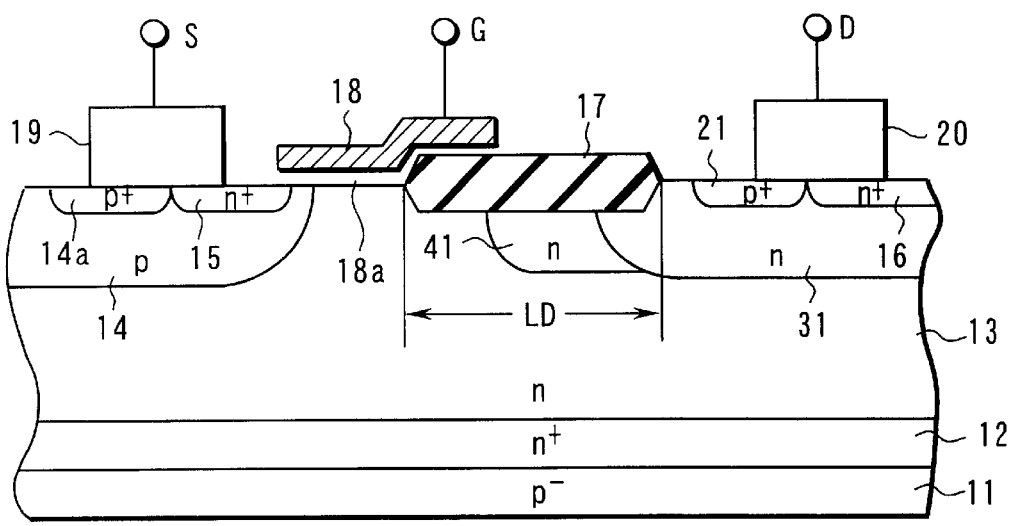
FIG. 6 is a cross-sectional view showing a semiconductor device according to a third embodiment of the present invention.

FIG. 6 shows a semiconductor device according to a third embodiment of the present invention. In FIG. 6, the same constituting elements as those of the second embodiment are denoted by the same reference numerals and only the elements different therefrom will now be described. In the second embodiment shown in FIG. 4, when a voltage is applied to the gate electrode 18 and a higher voltage is applied to the drain layer 16, current concentrates on the end portion of the n-type buffer layer 31 and the electric field is strengthened at this end portion, with the result that an avalanche current is generated. The avalanche current serves as a base current of the parasitic pnp transistor, and the LDMOS is likely to perform the same operation as that of an IGBT within the range of the rated voltage as illustrated in FIG. 5.

In the third embodiment, as shown in FIG. 6, an n-type offset layer 41 is formed adjacent to the n-type buffer layer 31 in the active layer 13 that is formed directly under an LOCOS oxide film 17. The offset layer 41 mitigates an electric field at an end portion of the buffer layer 31 and suppresses the supply of base current to the parasitic pnp transistor when a large current flows. Implanting phosphorus ions into the active layer 13 allows the n-type offset layer 41 to be formed. It is desirable that the net dose of phosphorus ions ranges from $1.5 \times 10^{12}$ to $4 \times 10^{12}$/cm$^2$.

According to the third embodiment described above, the IGBT operation can reliably be suppressed within the range of a steady-state voltage and the breakdown voltage of the LDMOS can be improved when a large current flows. Moreover, good ESD reliability can be obtained under ESD by the same operation as that of the second embodiment.

Figure 7:
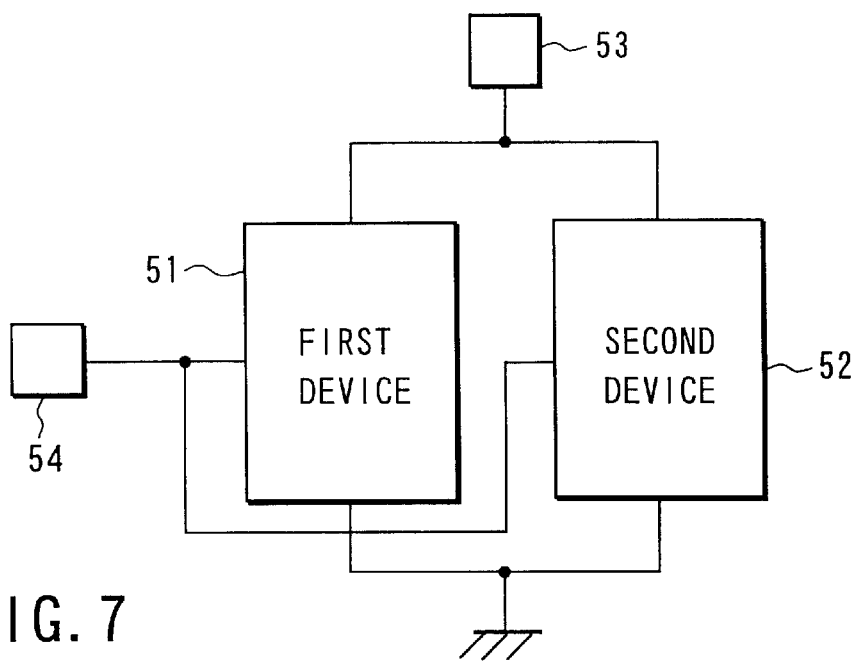
FIG. 7 is a block diagram showing a semiconductor device according to a fourth embodiment of the present invention.

FIG. 7 shows a semiconductor device according to a fourth embodiment of the present invention. In the fourth embodiment, a first device 51 constituted of an LDMOS having a p+-type anode layer 21 as in the first to third embodiments and a second device 52 constituted of an LDMOS with a conventional structure excluding the anode layer 21 are connected in parallel to both a pad 53 and the ground. The gate electrodes of the first and second devices 51 and 52 are connected to a pad 54. It is desirable that the static breakdown voltage of the first device 51 is set lower than that of the second device.

With the above structure, the first device 51 operates faster than the second device 52. The second device 52 can thus be prevented from being destroyed.

Figure 8:
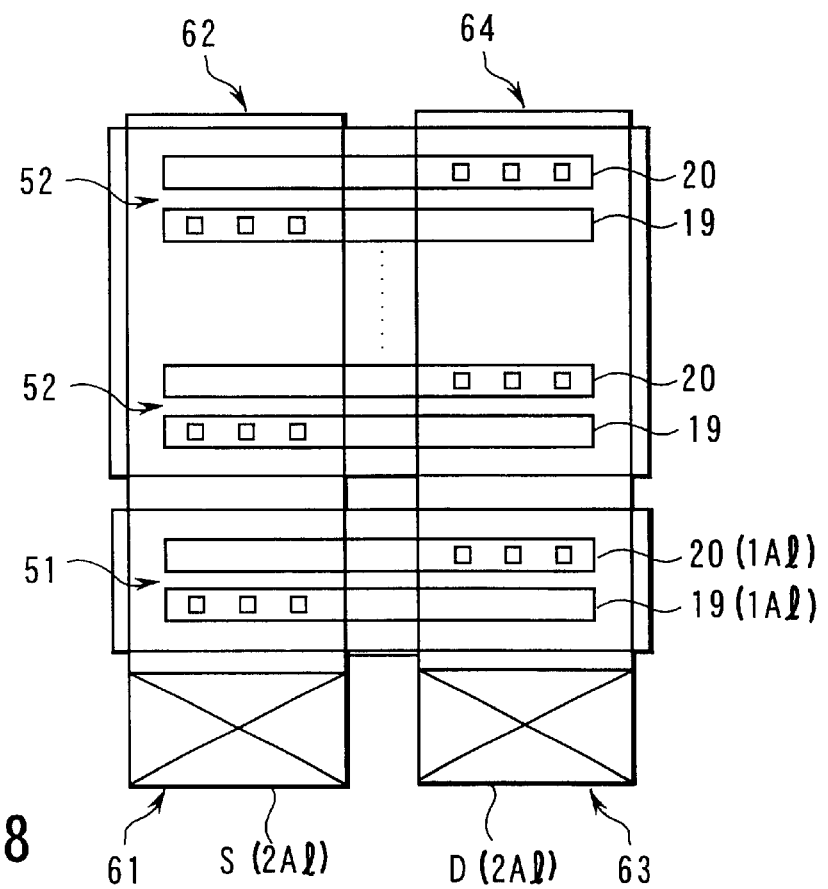
FIG. 8 is a plan view showing a semiconductor device according to a fifth embodiment of the present invention.

FIG. 8 shows a semiconductor device according to a fifth embodiment of the present invention. The fifth embodiment is directed to a modification to the fourth embodiment. In FIG. 8, the same constituting elements as those in FIG. 7 are indicated by the same reference numbers. In the fifth embodiment, a first device 51 having a p+-type anode layer 21 is connected to second devices 52 having no p+-type anode layers. When first devices 51 and second devices 52 are connected in parallel to pad 61 and pad 63, the first device 51 whose ESD reliability is great is arranged near pads. More specifically, a pad 61 to which a source layer S is connected, is connected to source wiring 62 that is made of aluminum (2Al) of the second layer, while a pad 63 to which a drain layer D is connected is connected to drain wiring 64 that is made of aluminum (2Al) of the second layer. The first device 51 is provided close to the pads 61 and 63, and the plurality of second devices 52 are arranged at a distance from these pads. The source electrodes 19 of the first and second devices 51 and 52 are connected to the source wiring 62 and the drain electrodes 20 thereof are connected to the drain wiring 64.

According to the fifth embodiment described above, the first device 51 whose ESD strength is great is provided close to the pads 61 and 63; therefore, the second device 52 can reliably be protected at the time of ESD.

Since the p+-type anode layer 21 is formed in the LDMOS, the LDMOS is lengthened in its channel direction and thus increased in area. Therefore, an LDMOS with the p+-type anode layer 21 is constituted of elements enough to secure ESD strength, and a normal LDMOS is formed of the remaining elements. Such a structure allows the LDMOS to improve in ESD strength without sacrificing the area of the elements too large.

In this modification, a layout of two wiring layers has been described; however, three or more wiring layers can be employed. Furthermore, the wiring of the second layer is made of aluminum; however, it can be made of other metal materials.

Figure 9:
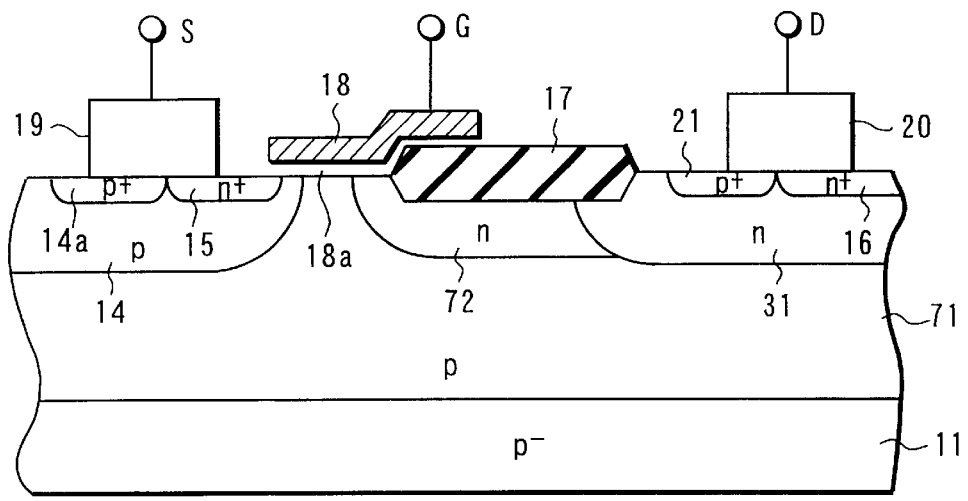
FIG. 9 is a cross-sectional view showing a semiconductor device according to a sixth embodiment of the present invention.

FIG. 9 illustrates a semiconductor device according to a sixth embodiment of the present invention. In FIG. 9, the same constituting elements as those of the third embodiment shown in FIG. 6 are denoted by the same reference numerals. In the foregoing first to fifth embodiments, the base, source, drain and anode layers are formed in the n-type active layer 13. In the sixth embodiment, a p-type active layer 71 is used in place of the n-type active layer 13 and, in this case, an n-type offset layer 72 extends under a gate electrode 18. Thus, the LDMOS of the present invention can be constituted using the p-type active layer 71.

Figure 10:
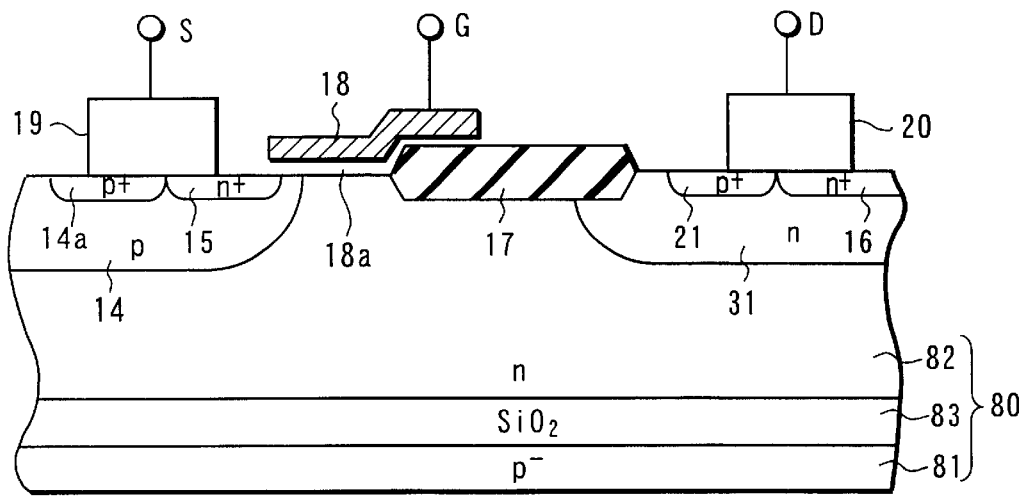
FIG. 10 is a cross-sectional view showing a semiconductor device according to a seventh embodiment of the present invention.

FIG. 10 illustrates a semiconductor device according to a seventh embodiment of the present invention. In this embodiment, an SOI (silicon on insulator) substrate 80 is employed. The SOI substrate 80 is constituted of a p-type silicon substrate 81, an n-type silicon substrate 82, and a SiO₂ layer 83 provided therebetween. As in the structure shown in FIG. 4, an LDMOS is formed in the n-type silicon substrate 82. In FIG. 10, the same constituting elements as those in FIG. 4 are indicated by the same reference numerals.

According to the seventh embodiment, since the LDMOS of the present invention having an anode layer 21 is formed in the SOI substrate 80, it can be improved in ESD strength by the action of the anode layer 21. Since, moreover, the SiO₂ layer 83 is formed as an insulation layer immediately under the n-type silicon substrate 82 serving as an active layer, the breakdown voltage of the LDMOS can be heightened more than that of an LDMOS using normal bulk silicon.

The seventh embodiment is directed to the SOI substrate applied to the structure of the second embodiment. However, the SOI substrate can be applied to the structures of the other embodiments.

Figure 11:
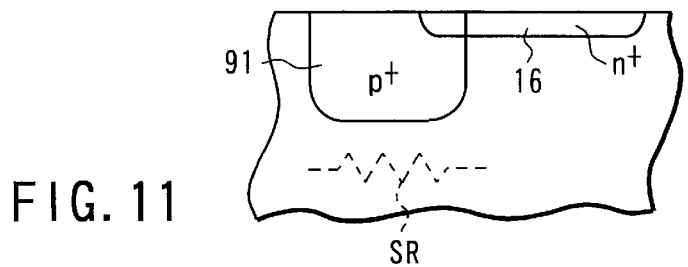
FIG. 11 is a cross-sectional view showing a semiconductor device according to an eighth embodiment of the present invention.

FIG. 11 illustrates a semiconductor device according to an eighth embodiment of the present invention. In the first to seventh embodiments, the drain and anode layers 16 and 21 are formed to the same depth. In the eighth embodiment, an anode layer 91 is formed more deeply than a drain layer 16, and these layers overlap each other. With this structure, the width d of the anode layer 91 can be fixed even when a mask is misaligned in forming the anode layer 91. Consequently, the sheet resistance SR of the active layer 13 and buffer layer 31 that are formed directly under the anode layer 91 can correctly be set.

Figure 12:
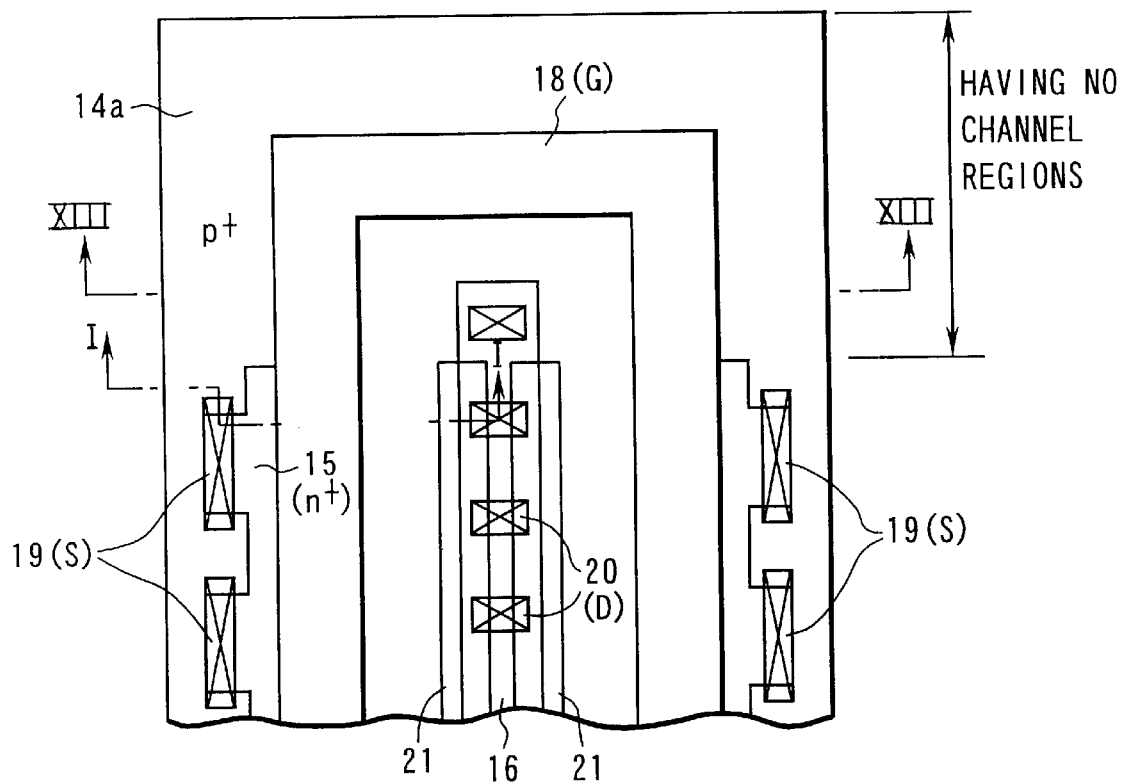
FIG. 12 is a plan view showing a part of a semiconductor device according to a ninth embodiment of the present invention.
Figure 13:
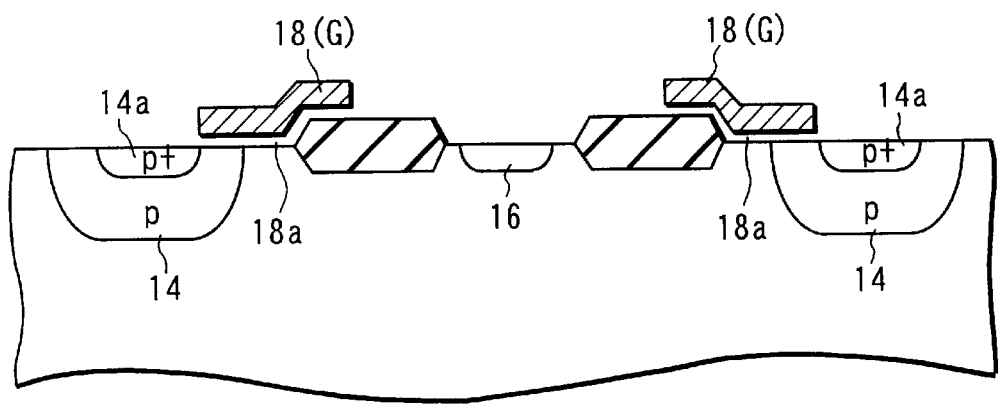
FIG. 13 is a cross-sectional view taken along line XIII—XIII of FIG. 12.

FIGS. 12 and 13 illustrate a semiconductor device according to a ninth embodiment of the present invention. In FIGS. 12 and 13, the same constituting elements as those of the first to eighth embodiments are denoted by the same reference numerals. FIG. 13 is a cross-sectional view taken along line XIII—XIII of FIG. 12.

As illustrated in FIGS. 12 and 13, a p+-type anode layer 21 is formed in the central part of an n+-type drain layer 16 so as to extend in the longitudinal direction of the layer 16 and, in other words, the anode layer 21 is not formed at end portions of the drain layer 16. An n+-type source layer 15 is formed only in the part corresponding to the anode layer 21, not close to the corners of a gate electrode 18. In other words, no channel regions are formed near the corners of the gate electrode 18. FIG. 12 shows only one end portion of the drain layer 16 and the other end portion thereof, not shown, has the same structure.

The above structure prevents current from concentrating on the end portions of the drain layer 16 when the gate electrode is set at a high level during the normal operation. If current concentrates on the end portions of the drain layer 16, there is a case where only the end portions of the layer 16 are brought into conduction and the other portions thereof are brought out of conduction. According to the ninth embodiment, however, current does not concentrate on the end portions of the drain layer 16 but flows almost all the drain layer 16 in its longitudinal direction. Thus, the whole of the drain layer 16 is brought into conduction and contributes to the thyristor operation, thereby performing a stable operation.

The foregoing ninth embodiment can be applied to each of the first to eighth embodiments. In this case, the same advantage as that of the ninth embodiment can be obtained.

Figure 14:
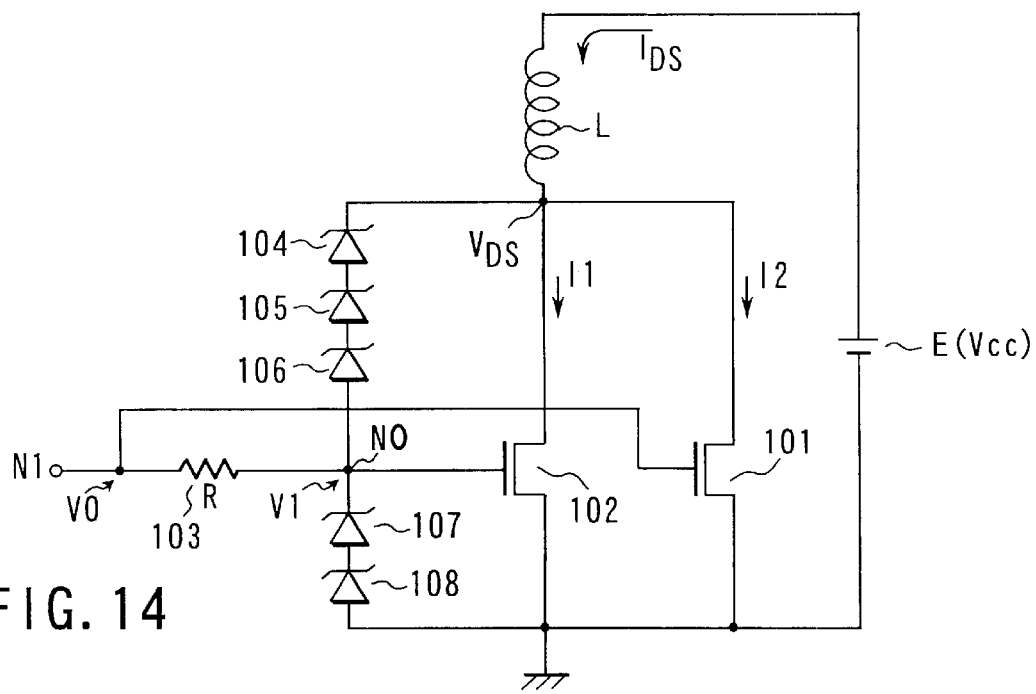
FIG. 14 is a circuit diagram showing a semiconductor device according to a tenth embodiment of the present invention.

FIG. 14 shows a semiconductor device according to a tenth embodiment of the present invention, which is directed to a modification to the fourth embodiment illustrated in FIG. 7. In the tenth embodiment, an LDMOS drives a load constituted of an inductance.

As shown in FIG. 14, a positive pole of a DC power supply E is connected to one end of an inductance L. The other end of the inductance L is connected to both the drain of an n-type LDMOS 101 as disclosed in the first to ninth embodiments of the present invention and the drain of an n-type LDMOS 102 having a conventional structure. The LDMOS 101 functions as a protective element of the LDMOS 102. The sources of the LDMOS 101 and 102 are connected to a negative pole of the DC power supply E. The gate of the LDMOS 101 is connected to a node N1, and that of the LDMOS 102 is connected to the node N1 through, e.g., a resistor 103. The resistor 103 has a function of allowing the LDMOS 101 to turn on and turn off prior to the LDMOS 102.

In order to cause the LDMOS 101 to perform the above operation, an element other than the resistor 103 can be used. For example, the gate electrode of the LDMOS 102 is connected to a node other than the node N1, and a signal generated by delaying a signal supplied to the node N1 can be used.

Zener diodes 104, 105 and 106 are connected in series between the other end of the inductance L and a connection mode N0 of the gate of the LDMOS 102 and the resistor 103. Zener diodes 107 and 108 are connected in series between the node N1 and the sources of the LDMOS 101 and 102. The Zener diodes 104 to 108 have a function of clamping the drain voltage of the LDMOS 101 and 102 and the gate voltage of the LDMOS 102.

Assuming that the voltage of the LDMOS 101 and 102 clamped by the Zener diodes 104 to 108 is BV1, the breakdown voltage of the LDMOS 102 is BV2, and the breakdown voltage of the LDMOS 101 serving as a protective element is BV3, the following relationship is derived:

$$BV1 < BV3 < BV2$$

Figure 15:
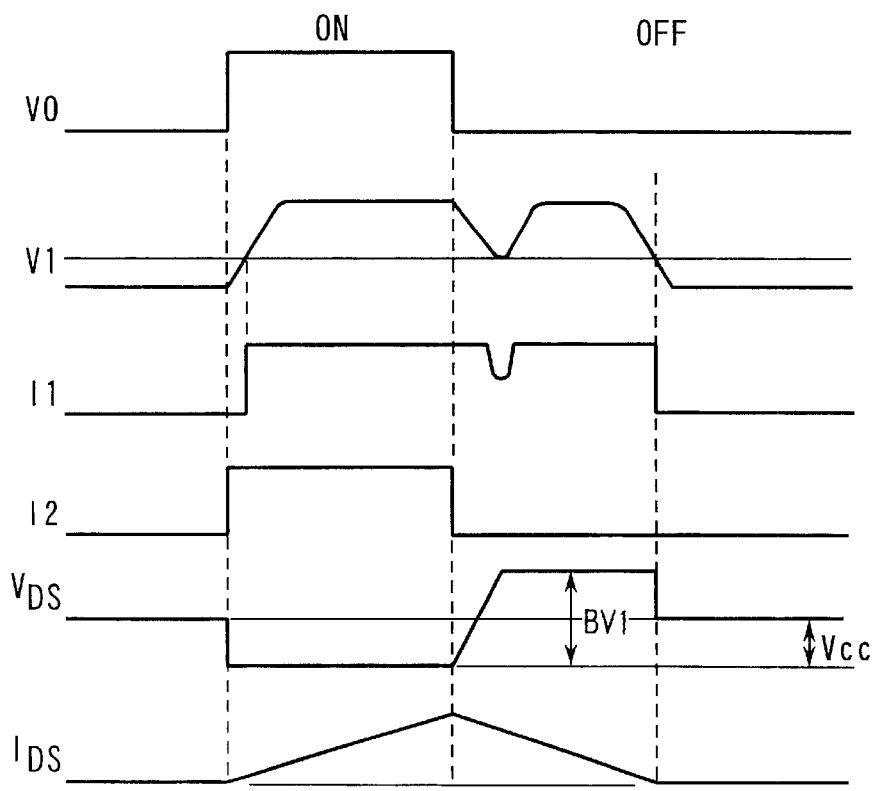
FIG. 15 is a waveform chart showing an operation of the device in FIG. 14.

An operation of the circuit shown in FIG. 10 will now be described with reference to FIG. 15. When a high-level signal is supplied to the node N1, the LDMOS 102 first turns on and then the LDMOS 101 turns on. In other words, the LDMOS 101 turns on later than the LDMOS 102 because the resistor 103 delays the charging of the gate electrode. When the LDMOS 101 and 102 turn on in this manner, the drain-to-source voltage $V_{DS}$ of the LDMOS 101 and 102 changes from a power supply voltage Vcc to a ground potential. Accordingly, the drain-to-source current $I_{DS}$ of the LDMOS 101 and 102 increases linearly.

When the level of a signal supplied to the node N1 becomes low, the LDMOS 101 turns off first. The LDMOS 102 turns off after the LDMOS 101 due to the resistor 103. Thus, the drain-to-source voltage $V_{DS}$ of the LDMOS 102 and 101 is suddenly heightened by the counterelectromotive force of the inductance L. At this time, the Zener diodes 104 to 108 are brought into conduction by the relationship between the clamped voltage and the breakdown voltages of the LDMOS 101 and 102. The gate of the LDMOS 102 is charged with the voltages of the Zener diodes 104 and 106, and the LDMOS 102 is brought into an on state. The potential V1 of the node N0 increases, whereas the potential V0 of the node N1 hardly increases because of the resistor 103. Therefore, the LDMOS 101 is held in an off state. Thus, current corresponding to the counterelectromotive force of the inductance L flows through the LDMOS 102 but not through the LDMOS 101. If energy is released from the inductance L, the LDMOS 102 turns off.

When a surge voltage is applied to the drains of the LDMOS 101 and 102 by ESD, the LDMOS 101 turns on faster than the LDMOS 102 by the Zener diodes. The area of the Zener diodes cannot sufficiently be increased in terms of costs. In other words, the LDMOS 102 has such a large gate capacitance that it cannot produce an adequate driving current corresponding to a high-speed pulse such as ESD. In other words, the avalanche breakdown of the LDMOS 101 occurs at higher speed. For this reason, almost all the current corresponding to the surge voltage flow into the LDMOS 101 by the thyristor operation of the LDMOS 101. The LDMOS 102 can thus be prevented from being destroyed.

According to the tenth embodiment described above, the LDMOS 101 having the structure of the present invention, which serves as a protective element, is connected in parallel with the LDMOS 102 having a normal structure, and both the LDMOS 101 and 102 are operated in the normal mode. Necessary current-carrying capacity can thus be obtained.

When the LDMOS 101 and 102 turn off, the LDMOS 101 is held in an off-state by the resistor 103 and almost all the current corresponding to the counterelectromotive force of the inductance L flow into the LDMOS 102 that is held in an on-state by the Zener diodes 104 to 108. Even though excessive current flows, it can be cut off against the operation of the parasitic thyristor of the LDMOS 101. The circuit can thus be improved in stability.

When the surge voltage is applied, the LDMOS 101 whose withstand voltage is lower than that of the LDMOS 102 turns on prior to the Zener diodes 104 to 108. The LDMOS 102 can thus be protected with reliability.

Figure 16:
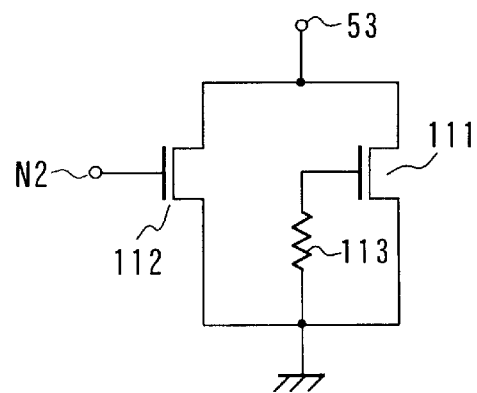
FIG. 16 is a circuit diagram showing a semiconductor device according to an eleventh embodiment of the present invention.

FIG. 16 illustrates a semiconductor device according to an eleventh embodiment of the present invention. The eleventh embodiment is directed to a modification to the fourth embodiment shown in FIG. 7.

In FIG. 16, an LDMOS 111 having a p$^+$-type anode layer 21 as disclosed in the foregoing first to ninth embodiments and a conventional LDMOS 112 having no p$^+$-type anode layer are connected in parallel to each other between the pad 53 and the ground. The gate of the LDMOS 112 is connected to a signal input node N2 and that of the LDMOS 111 is grounded via a resistor 113.

In the fourth embodiment, the first device 51 constituted of an LDMOS having a p$^+$-type anode layer 21 operates in the normal mode, together with the second device 52 constituted of a conventional LDMOS having no p$^+$-type anode layer. In contrast, according to the eleventh embodiment, the LDMOS 111 does not operate but turns off in the normal mode, and turns on under the ESD stress. Thus, the LDMOS 112 can reliably be protected.

Furthermore, the LDMOS 111 turns off during the normal operation. It is unnecessary to provide such a structure as to prevent the anode layer 21 from operating at a rated voltage. In other words, the buffer layer 31 shown in FIGS. 4 and 6 corresponding to the second and third embodiments is not needed. The manufacture of the device can thus be simplified.

In the respective embodiments described above, in order to latch the LDMOS having a p$^+$-type anode layer 21 or 91, an avalanche current generated at the end portions of the anode layer plays an important roll, and the breakdown voltage needs to lower more than that of the LDMOS having no P$^+$-type anode layers. As one method of lowering the static breakdown, the drift length LD of the LDMOS with the p$^+$-type anode layer 21 has only to be shortened more than that of the LDMOS with no p$^+$-type anode layers.

The semiconductor devices according to the first to seventh embodiments can be practiced even though their conductivity types are all inverted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

an active layer of a first conductivity type;

a base layer of a second conductivity type formed in a surface area of the active layer;

a source layer of the first conductivity type formed in a surface area of the base layer;

a drain layer of the first conductivity type formed in the surface area of the active layer at a distance from the base layer;

an anode layer of the second conductivity type formed adjacent to the drain layer between the base layer and the drain layer;

a gate layer formed between the source layer and the drain layer and on the base layer with a gate insulation film interposed therebetween;

a source electrode formed on a surface of the base layer and that of the source layer; and a drain electrode formed on a surface of the drain layer and that of the anode layer, wherein the anode layer constitutes a parasitic thyristor, together with the source layer, the base layer, and the active layer, when ESD occurs, and wherein the anode layer is formed only in almost central part of the drain layer so as to extend in a longitudinal direction of the drain layer.

2. The device according to claim 1, wherein the source layer is formed only in a region corresponding to the anode layer.

3. A semiconductor device comprising:

an active layer of a first conductivity type;

a base layer of a second conductivity type formed in a surface area of the active layer;

a source layer of the first conductivity type formed in a surface area of the base layer;

a drain layer of the first conductivity type formed in the surface area of the active layer at a distance from the base layer;

an anode layer of the second conductivity type formed adjacent to the drain layer between the base layer and the drain layer;

a gate layer formed between the source layer and the drain layer and on the base layer with a gate insulation film interposed therebetween;

a source electrode formed on a surface of the base layer and that of the source layer; and a drain electrode formed on a surface of the drain layer and that of the anode layer, wherein the anode layer constitutes a parasitic thyristor, together with the source layer, the base layer, and the active layer, when ESD occurs, and wherein a condition for preventing current from flowing into the active layer from the anode layer satisfies following formulae when a thickness of the gate insulation film is tox(cm), a rated gate voltage is Vg(V), a rated drain voltage is Vd(V), and a static breakdown voltage is Vb(V):

$$Vg \leq 2 \times 10^6 \cdot tox$$

$$Vd \leq 0.7 \cdot Vb.$$

4. A semiconductor device comprising:

an active layer of a first conductivity type;

a base layer of a second conductivity type formed in a surface area of the active layer;

a source layer of the first conductivity type formed in a surface area of the base layer;

a drain layer of the first conductivity type formed in the surface area of the active layer at a distance from the base layer;

an anode layer of the second conductivity type formed adjacent to the drain layer between the base layer and the drain layer;

a gate layer formed between the source layer and the drain layer and on the base layer with a gate insulation film interposed therebetween;

a source electrode formed on a surface of the base layer and that of the source layer; and a drain electrode formed on a surface of the drain layer and that of the anode layer, wherein the anode layer constitutes a parasitic thyristor, together with the source layer, the base layer, and the active layer, when ESD occurs, wherein a buffer layer of the first conductivity type that surrounds the anode layer, and wherein a dose n1 of impurity ions in the buffer layer satisfies a following formula when mobility of carries is $\mu$ (cm$^2$/V·S), a length of the anode layer is d(cm), a drain current per centimeter of channel width at a rated voltage is ID, and an amount of electron charge is q(C):

$$\tfrac{5}{8} \cdot (ID \cdot d)/(q \cdot \mu) \leq n1.$$

5. A semiconductor device comprising:

an active layer of a first conductivity type;

a base layer of a second conductivity type formed in a surface area of the active layer;

a source layer of the first conductivity type formed in a surface area of the base layer;

a drain layer of the first conductivity type formed in the surface area of the active layer at a distance from the base layer;

an anode layer of the second conductivity type formed adjacent to the drain layer between the base layer and the drain layer;

a gate layer formed between the source layer and the drain layer and on the base layer with a gate insulation film interposed therebetween;

a source electrode formed on a surface of the base layer and that of the source layer; and a drain electrode formed on a surface of the drain layer and that of the anode layer, wherein the anode layer constitutes a parasitic thyristor, together with the source layer, the base layer, and the active layer, when ESD occurs, wherein a buffer layer of the first conductivity type that surrounds the anode layer, and wherein when a length of the anode layer is d(cm) and a drain current per centimeter of channel width at a rated voltage is ID, a sheet resistance Rs of the active layer, which is located directly under the anode layer, is given by:

$$Rs \leq 0.8/d \cdot 1/ID (\Omega/\square).$$

6. The device according to claim 5, further comprising an offset layer of the first conductivity type formed in the active layer between the base layer and the anode layer.

7. The device according to claim 6, wherein a dose of impurity ions in the offset layer ranges from $1.5 \times 10^{12}$ to $4 \times 10^{12}$/cm$^2$.

8. A semiconductor device comprising:

an active layer of a first conductivity type;

a base layer of a second conductivity type formed in a surface area of the active layer;

a source layer of the first conductivity type formed in a surface area of the base layer;

a drain layer of the first conductivity type formed in the surface area of the active layer at a distance from the base layer;

an anode layer of the second conductivity type formed adjacent to the drain layer between the base layer and the drain layer;

a gate layer formed between the source layer and the drain layer and on the base layer with a gate insulation film interposed therebetween;

a source electrode formed on a surface of the base layer and that of the source layer; and a drain electrode formed on a surface of the drain layer and that of the anode layer, wherein the anode layer constitutes a parasitic thyristor, together with the source layer, the base layer, and the active layer, when ESD occurs, and wherein the anode layer is formed more deeply than the drain layer, and the anode layer overlaps the drain layer.

9. A semiconductor device comprising:

a first device constituted of a lateral DMOS including:

an active layer of a first conductivity type,
a first base layer of a second conductivity type provided in the active layer,
a first source layer of the first conductivity type provided in the first base layer,
a first drain layer of the first conductivity type formed in the active layer at a distance form the first source layer,
an anode layer of the second conductivity type formed adjacent to the first drain layer, and
a first gate layer formed between the first source layer and the first drain layer and above the first base layer with a gate insulation film interposed therebetween; and a second device constituted of a lateral MDOS including:
a second base layer of the second conductivity type provided in the active layer,
a second source layer of the first conductivity type provided in the second base layer,
a second drain layer of the first conductivity type formed in the active layer at a distance form the second source layer, and
a second gate layer formed between the second source layer and the second drain layer and above the second base layer with a gate insulation film interposed therebetween;

a source electrode for connecting the first source layer and the second source layer to each other; and
a drain electrode for electrically connecting the first drain layer and the anode layer to the second drain layer,
wherein the anode layer is formed only in almost central part of the first drain layer so as to extend in a longitudinal direction of the drain layer.

10. The device according to claim 9, wherein the first source layer is formed only in a region corresponding to the first drain layer.

11. The device according to claim 9, which has a condition for preventing current from flowing into the active layer from the anode layer, the condition satisfying following formulas when a thickness of the gate insulation film is tox (cm), a rated gate voltage is Vg(V), a rated drain voltage is Vd(V), and a static breakdown voltage is Vb(V):

$$Vg \leq 2 \times 10^6 \cdot tox$$

$$Vd \leq 0.7 \cdot Vb.$$

12. The device according to claim 9, further comprising a buffer layer of the first conductivity type that surrounds the anode layer.

13. The device according to claim 12, wherein a dose n1 of impurity ions in the buffer layer satisfies a following formula when mobility of carries is $\mu$ (cm$^2$/V·S), a length of the anode layer is d(cm), a drain current per centimeter of channel width at a rated voltage is ID, and an amount of electron charge is q(C):

$${}^5\!/_8 \cdot (ID \cdot d)/(q \cdot \mu) \leq n1.$$

14. The device according to claim 12, wherein when a length of the anode layer is d(cm) and a drain current per centimeter of channel width at a rated voltage is ID, a sheet resistance Rs of the active layer, which is located directly under the anode layer, is given by:

$$Rs \leq 0.8/d \cdot 1/ID (\Omega/\Box).$$

15. The device according to claim 14, further comprising an offset layer of the first conductivity type formed in the active layer between the base layer and the anode layer.

16. The device according to claim 15, wherein a dose of impurity ions in the offset layer ranges from $1.5 \times 10^{12}$ to $4 \times 10^{12}$/cm$^2$.

17. The device according to claim 9, wherein the first device has a static breakdown voltage that is lower than that of the second device.

18. The device according to claim 9, wherein the first device is interposed between the second device and a pad.

19. The device according to claim 9, wherein the anode layer is formed more deeply than the first drain layer, and the anode layer overlaps the first drain layer.

20. The device according to claim 9, further comprising:
a Zener diode connected between the drain electrode and a gate electrode of the second device.

21. The device according to claim 20, wherein the first device turns off faster than the second device.

22. The device according to claim 21, further comprising a resistor connected between a gate electrode and an input node of the second device.

23. The device according to claim 12, further comprising a resistor one end of which is connected to a gate electrode of the first device and another end of which is grounded.

* * * * *